US008067992B2

(12) United States Patent
Chen et al.

(10) Patent No.: US 8,067,992 B2
(45) Date of Patent: Nov. 29, 2011

(54) TEMPERATURE COMPENSATION CIRCUIT AND METHOD

(75) Inventors: Alex Jianzhong Chen, Irvine, CA (US); Gim Eng Chew, Penang (MY); Tong Tee Tan, Johor (MY); Kok Chin Pan, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 73 days.

(21) Appl. No.: 12/134,323

(22) Filed: Jun. 6, 2008

(65) Prior Publication Data

US 2009/0302954 A1    Dec. 10, 2009

(51) Int. Cl.
*H03K 3/26* (2006.01)

(52) U.S. Cl. .......... 331/111; 331/66; 331/143; 331/175; 331/176

(58) Field of Classification Search .......... 331/66, 331/111, 143, 175, 176
See application file for complete search history.

(56) References Cited

U.S. PATENT DOCUMENTS

| | | | |
|---|---|---|---|
| 5,180,995 A * | 1/1993 | Hayashi et al. | 331/57 |
| 5,699,024 A | 12/1997 | Manlove et al. | |
| 5,859,560 A | 1/1999 | Matthews | |
| 5,859,571 A * | 1/1999 | Lee et al. | 331/53 |
| 5,870,004 A | 2/1999 | Lu | |
| 6,157,270 A * | 12/2000 | Tso | 331/176 |
| 6,356,161 B1 * | 3/2002 | Nolan et al. | 331/176 |
| 6,720,836 B2 | 4/2004 | Lin | |
| 6,856,180 B1 * | 2/2005 | Starr et al. | 327/147 |
| 6,956,417 B2 * | 10/2005 | Bernstein et al. | 327/157 |
| 7,034,627 B1 | 4/2006 | Kudari | |
| 0,279,141 A1 | 12/2007 | Chui, Martin Y. | |
| 7,432,771 B2 * | 10/2008 | Chui | 331/144 |
| 7,654,736 B1 * | 2/2010 | Walker | 374/176 |
| 2005/0219034 A1 * | 10/2005 | Yoshikawa | 338/9 |

FOREIGN PATENT DOCUMENTS

| | | |
|---|---|---|
| JP | 6-169237 | 6/1994 |
| WO | WO-2005/101664 | 10/2005 |

OTHER PUBLICATIONS

Silicon Oscillator withg Low-Power Frequency Select, Reset Output, and Enable; MAXIM384, MAMIX; 19-3493; Rev. 2; Apr. 2007.

"A New Low-Noise 100-MHz Balanced Relaxation Oscillator;" Sneep at al.: ,IEEE Journal of Solid State Circuits, vol. 25, No. 3, Hune, 1990.

"A Temperature Compensated Fully Trimmable On-Chip Oscillator;" Proceedings of the 16th Symposium on Integrated Circuis and Systems Design (SBCCI'03): 2003.

* cited by examiner

*Primary Examiner* — Arnold Kinkead
*Assistant Examiner* — Richard Tan

(57) ABSTRACT

Disclosed are various embodiments of temperature-compensated relaxation oscillator circuits that may be fabricated using conventional CMOS manufacturing techniques. The relaxation oscillator circuits described herein exhibit superior low temperature coefficient performance characteristics, and do not require the use of expensive off-chip high precision resistors to effect temperature compensation. Positive and negative temperature coefficient resistors arranged in a resistor array offset one another to provide temperature compensation in the relaxation oscillator circuit.

16 Claims, 5 Drawing Sheets

TEMPERATURE COMPENSATION CIRCUIT AND METHOD

FIELD OF THE INVENTION

Various embodiments of the invention described herein relate to the field of monolithic integrated circuits, and more particularly to CMOS monolithic relaxation oscillator circuits that are substantially insensitive to temperature variation, and components, devices, systems and methods associated therewith.

BACKGROUND

Oscillators are widely used in various microelectronic systems for such purposes as providing clock signals. In some applications, oscillators are used to produce steady stable clock signals which are relatively insensitive to temperature variations. For example, some oscillators in motion control encoders are required to operate across a wide temperature range, such as between −40 to 125 degrees Celsius.

To achieve accurate and stable clock signal performance over such a wide temperature range, designers typically employ external components such as crystals and inductors. These external solutions, however, place high cost and size burdens on the resulting circuit. Oscillators with external crystals and LC circuits are also difficult to integrate into monolithic circuits, and are usually characterized by narrow frequency bandwidths.

Relaxation oscillators, however, can be integrated in monolithic circuitry at relatively low cost and with small size. The frequency of a relaxation oscillator can be programmed, and thus can operate over a wide frequency band. Most relaxation oscillator circuits are sensitive to temperature variations, however, if temperature compensation circuitry is not employed.

In the current state of the art, temperature compensation techniques are employed to reduce the temperature coefficient of a relaxation oscillator. Basically, the frequency of the relaxation oscillator is made proportional to a charging current and inversely proportional to a threshold voltage.

In a first example of a prior art temperature-compensated relaxation oscillator circuit, and as described in further detail in U.S. Pat. No. 6,720,836 to Xijian Lin entitled "CMOS relaxation oscillator circuit with improved speed and reduced process temperature variations," the frequency of a relaxation oscillator is expressed as $F=I_{SINK}/(2 \cdot C_1 \cdot V_{CLMP})$. As a result, the frequency is proportional to the charging current, $I_{SINK}$, and inversely proportional to the value of the timing capacitor $C_1$ and the threshold voltage $V_{CLMP}$. The threshold voltage $V_{CLMP}$ is largely insensitive to the temperature variation. $V_{CLMP}$ can be expressed as $V_{CLMP}=k \cdot V_{ref}$, where k is a constant and $V_{ref}$ is a bandgap voltage. Because $I_{SINK}$ must be insensitive to temperature to make the frequency of relaxation oscillator independent of temperature, the capacitor, $C_1$, must have a low temperature coefficient. A precise low temperature coefficient resistor, such as an off-chip resistor $R_{ext}$, must therefore to be employed when using this temperature compensation technique, which increases circuit cost and size.

In a second example of a prior art temperature-compensated relaxation oscillator circuit, and as described in further detail in U.S. Pat. No. 6,157,270 to Vincent Wing Sing Tso entitled "Programmable highly temperature and supply independent oscillator," the frequency of a relaxation oscillator is proportional to the charging current and the threshold voltage $V_{th}$. The basic concept of this approach is to generate charging currents and threshold voltages having temperature-dependent parameters that substantially cancel one another to yield a temperature-independent output signal of constant frequency. While this temperature compensation technique reduces the temperature coefficient of the relaxation oscillator to around 294 ppm/° C. under typical operating conditions, this approach does not take into account the temperature coefficient of the resistor of the relaxation oscillator, with the result that temperature-induced variations in the output signal of the relaxation oscillator will occur unless a high precision off-chip resistor is used, which increases circuit cost and size.

In a third example of a prior art temperature-compensated relaxation oscillator circuit, and as described in further detail in U.S. Pat. No. 6,356,161 to James B. Nolan et al. entitled "Calibration techniques for a precision relaxation oscillator integrated circuit with temperature compensation," an expensive and space-consuming low temperature coefficient external off-chip resistor $R_{ext}$ is also employed to produce a more stable clock output signal of constant frequency, which is largely independent of temperature.

In a fourth example of a prior art temperature-compensated relaxation oscillator circuit, and as described in further detail in U.S. Pat. No. 5,699,024 to Gregory Jon Manlove et al. entitled "Accurate integrated oscillator circuit," there is provided an oscillator circuit having an acceptable degree of temperature independence. The temperature compensation circuit of Manlove et al. relies on the temperature behavior of a bipolar transistor, and thus requires the use of a bi-CMOS manufacturing process. This special requirement increases circuit cost.

What is needed is temperature compensation circuitry that may be used in conjunction with a relaxation oscillator to provide a low cost, small size, substantially temperature-insensitive, wide-frequency-band, clock circuit.

SUMMARY

In some embodiments, there is provided a relaxation oscillator circuit comprising a relaxation oscillator having an input and an output signal having a frequency, a field effect transistor (FET), a current mirror circuit configured to provide a charging current to the input of the relaxation oscillator and a biasing current to a drain of the FET, an operational amplifier having an output operably connected to a gate of the FET, a band-gap circuit operably connected to a first input of the operational amplifier, and a resistor array having an output operably connected to a source of the FET and a second input of the operational amplifier, where the resistor array further comprises a positive temperature coefficient resistor having a value $R_1$ and arranged in parallel respecting a negative temperature coefficient resistor having a value $R_2$, the values of $R_1$ and $R_2$ being selected such that the frequency of the output signal remains substantially constant despite changes in the ambient temperature to which the relaxation oscillator circuit is subjected.

In another embodiment, there is provided a relaxation oscillator circuit comprising a relaxation oscillator having an input and an output signal having a frequency, a field effect transistor (FET), a current mirror circuit configured to provide a charging current to the input of the relaxation oscillator and a biasing current to a drain of the FET, an operational amplifier having an output operably connected to a gate of the FET, a band-gap circuit operably connected to a first input of the operational amplifier, and a resistor array having an output operably connected to a source of the FET and a second input of the operational amplifier, where the resistor array further comprises a positive temperature coefficient resistor having a value $R_1$ and arranged in series respecting a negative temperature coefficient resistor having a value $R_2$, the values of $R_1$ and $R_2$ being selected such that the frequency of the output signal remains substantially constant despite changes in the ambient temperature to which the relaxation oscillator circuit is subjected.

In yet another embodiment, there is provided a method of compensating for variations in a frequency of an output signal provided by a relaxation oscillator circuit, where the variations would otherwise be induced by changes in ambient temperature comprising providing a relaxation oscillator having an input and an output signal having a frequency, providing a field effect transistor (FET), providing a current mirror circuit configured to provide a charging current to the input of the relaxation oscillator and a biasing current to a drain of the FET, providing an operational amplifier having an output operably connected to a gate of the FET, providing a band-gap circuit operably connected to a first input of the operational amplifier, and providing a resistor array having an output operably connected to a source of the FET and a second input of the operational amplifier, where the resistor array further comprises a positive temperature coefficient resistor having a value $R_1$ and arranged in parallel respecting a negative temperature coefficient resistor having a value $R_2$, the values of $R_1$ and $R_2$ being selected such that the frequency of the output signal remains substantially constant despite changes in the ambient temperature to which the relaxation oscillator circuit is subjected.

In still another embodiment, there is provided a method of compensating for variations in a frequency of an output signal provided by a relaxation oscillator circuit, where the variations would otherwise be induced by changes in ambient temperature comprising providing a relaxation oscillator having an input and an output signal having a frequency, providing a field effect transistor (FET), providing a current mirror circuit configured to provide a charging current to the input of the relaxation oscillator and a biasing current to a drain of the FET, providing an operational amplifier having an output operably connected to a gate of the FET, providing a band-gap circuit operably connected to a first input of the operational amplifier, and providing a resistor array having an output operably connected to a source of the FET and a second input of the operational amplifier, where the resistor array further comprises a positive temperature coefficient resistor having a value $R_1$ and arranged in series respecting a negative temperature coefficient resistor having a value $R_2$, the values of $R_1$ and $R_2$ being selected such that the frequency of the output signal remains substantially constant despite changes in the ambient temperature to which the relaxation oscillator circuit is subjected.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings, unless otherwise noted.

DETAILED DESCRIPTIONS OF SOME PREFERRED EMBODIMENTS

In various embodiments of the invention, temperature-compensated relaxation oscillator circuits, and corresponding components and methods, are provided such as temperature-compensated CMOS monolithic relaxation oscillator circuits, where the frequency of the output signal provided by the relaxation oscillator circuit is substantially insensitive to temperature variations.

The problems and shortcomings of prior art relaxation oscillator circuits described above are overcome in various embodiments of the invention.

For example, one embodiment of a relaxation oscillator circuit of the invention achieves a very low temperature coefficient of about 5 ppm/° C. under typical process corner simulation conditions. In contrast, and as described further in U.S. Pat. No. 6,157,270 to Tso, respective temperature coefficients of 294 ppm/° C. and ±550 ppm/° C. are provided. Typical process corner simulation results described in a Maxim Relaxation Oscillator Product MAX7384 data sheet by Jack G. Sneep and Chris J. M. Verhoeven in "A new low-noise 100-MHz balanced relaxation oscillator," IEEE Journal of Solid-State Circuits, pp 692-698, Vol. 25, No. 3, June 1990, and by A. Olmos in "A temperature compensated fully trimmable on-chip IC oscillator," Proceedings of the 16th-Symposium on Integrated Circuits and Systems Design (SBCCI'03), pp 181-186, 8-11 Sep. 2003, respectively, are ±100 ppm/° C., −1000 ppm/° C. and 606 ppm/° C.

Furthermore, unlike the devices and methods described in U.S. Pat. No. 6,720,836 to Lin, U.S. Pat. No. 6,157,270 to Tso, and U.S. Pat. No. 6,356,161 to Nolan, no external, precision, low-temperature-coefficient, off-chip resistor is required in the various embodiments of the invention.

In addition, expensive bi-CMOS processes are not required to fabricate chips incorporating the temperature-compensation circuitry of the invention. Indeed, the various embodiments of the relaxation oscillator of the invention are amenable, but not limited to, fabrication using conventional low-cost CMOS processes.

Figure 1:
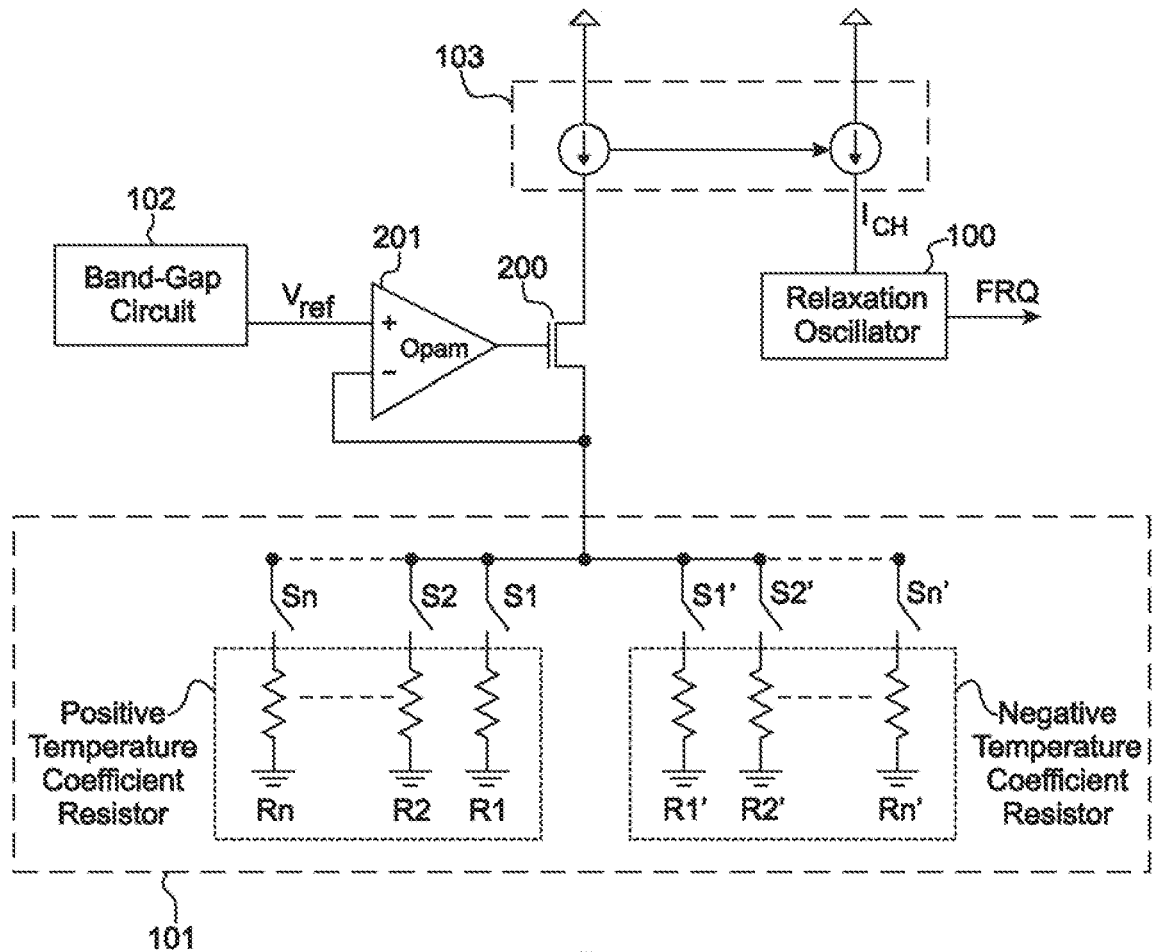
FIG. 1 shows one embodiment of a temperature-compensated relaxation oscillator circuit of the invention.

Referring now to FIG. 1, there is shown a block diagram of one embodiment of a circuit the invention. The relaxation oscillator circuit of FIG. 1 includes a relaxation oscillator 100 configured to provide an input charge current $I_{ch}$ and a frequency output, FRQ. The oscillator circuit further includes a current generating circuit comprising a resistor array 101, a band-gap circuit 102, a current mirror 103, an NMOS transistor 200 and an operational amplifier 201.

Figure 2:
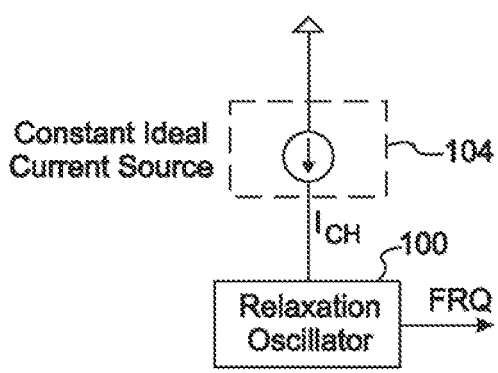
FIG. 2 shows another embodiment of a temperature-compensated relaxation oscillator circuit of the invention.

Referring now to FIG. 2, there is shown current mirror 103 and resistor array 101 of FIG. 1 being replaced by constant ideal current source 104, the output current provided by which is substantially independent of temperature. The frequency output of the relaxation oscillator of the FIG. 2, FRQ, has a temperature coefficient defined by:

$$TC_{OSC} = \alpha. \qquad \text{Eq. (1)}$$

Figure 3:
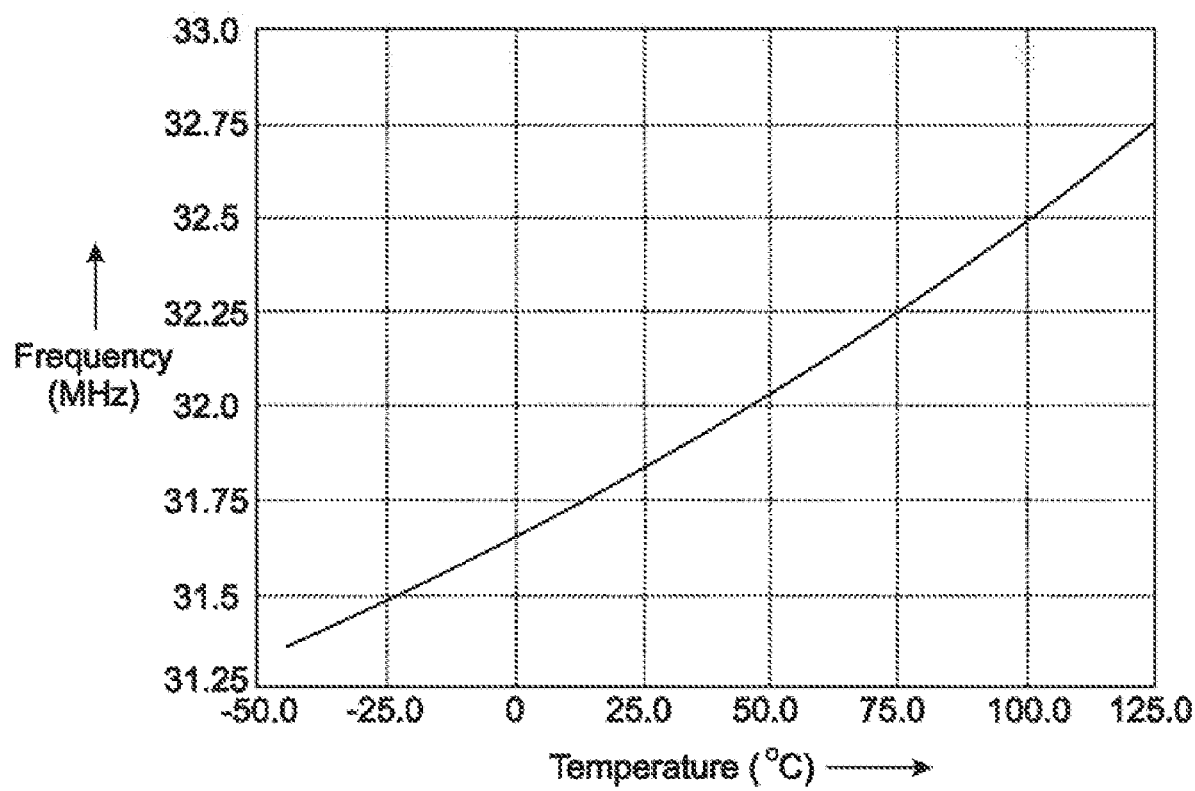
FIG. 3 shows a simulated output provided by the circuit of FIG. 1.

FIG. 3 shows a simulated output provided by the circuit of FIG. 1, where the output is described in terms of frequency versus temperature. It will be seen that the average output is around 32 MHz and varies with the temperature. Referring to FIG. 1, the output charging current circuit, $I_{CH}$ has a temperature coefficient defined by $TC_{CC}=\beta$. Output signal FRQ is proportional to charging current $I_{CH}$. Consequently, output signal FRQ of the relaxation oscillator circuit of FIG. 1 may be expressed as:

$$TC'_{OSC}=\alpha+\beta. \qquad \text{Eq. (2)}$$

The net temperature coefficient associated with output signal FRQ will now be seen to approach to zero. That is:

$$TC'_{OSC}=\alpha+\beta\approx 0, \text{ if } \beta\approx -\alpha \qquad \text{Eq. (3)}$$

Charging current $I_{CH}$ is defined by the output $V_{REF}$ provided by band-gap circuit 102 and the resistance of the resistor array R, which may be expressed as:

$$I_{CH}=V_{REF}/R \qquad \text{Eq. (4)}$$

Thus, the temperature coefficient of the charging current ($TC_{CC}$) is opposite in sign to the temperature coefficient of the resistor array ($TC_{RA}$) because $V_{REF}$ is substantially insensitive to temperature variation. That is:

$$TC_{CC}=-TC_{RA}=\beta \qquad \text{Eq. (5)}$$

Resistor array 101 in FIG. 1 comprises two different types of resistors whose temperature coefficients are of opposite sign. In a typical CMOS process, poly resistors, diffusion resistors and nwell resistors have positive temperature coefficients ($TC_{PR}$), while high-poly resistors have negative temperature coefficients ($TC_{NR}$). The total temperature coefficient of the resistor array, $TC_{RA}$, can be any value between $TC_{PR}$ and $TC_{NR}$ by switching on or off appropriate switches, S1 ... Sn and S1' ... Sn', in resistor array 101 and thus varying the ratios of the values of the two different types of resistors. That is:

$$TC_{NR}<TC_{RA}=-\beta<TC_{PR} \qquad \text{Eq. (6)}$$

Consequently, the final temperature coefficient of the resistor array ($TC_{RA}$) can be properly designed to ensure that:

$$TC'_{OSC}=TC_{OSC}TC_{CC}=TC_{OSC}-TC_{RA}=\alpha+\beta\approx 0, \text{ if } \\ TC_{NR}<TC_{OSC}=\alpha<TC_{PR}. \qquad \text{Eq. (7)}$$

Figure 4:
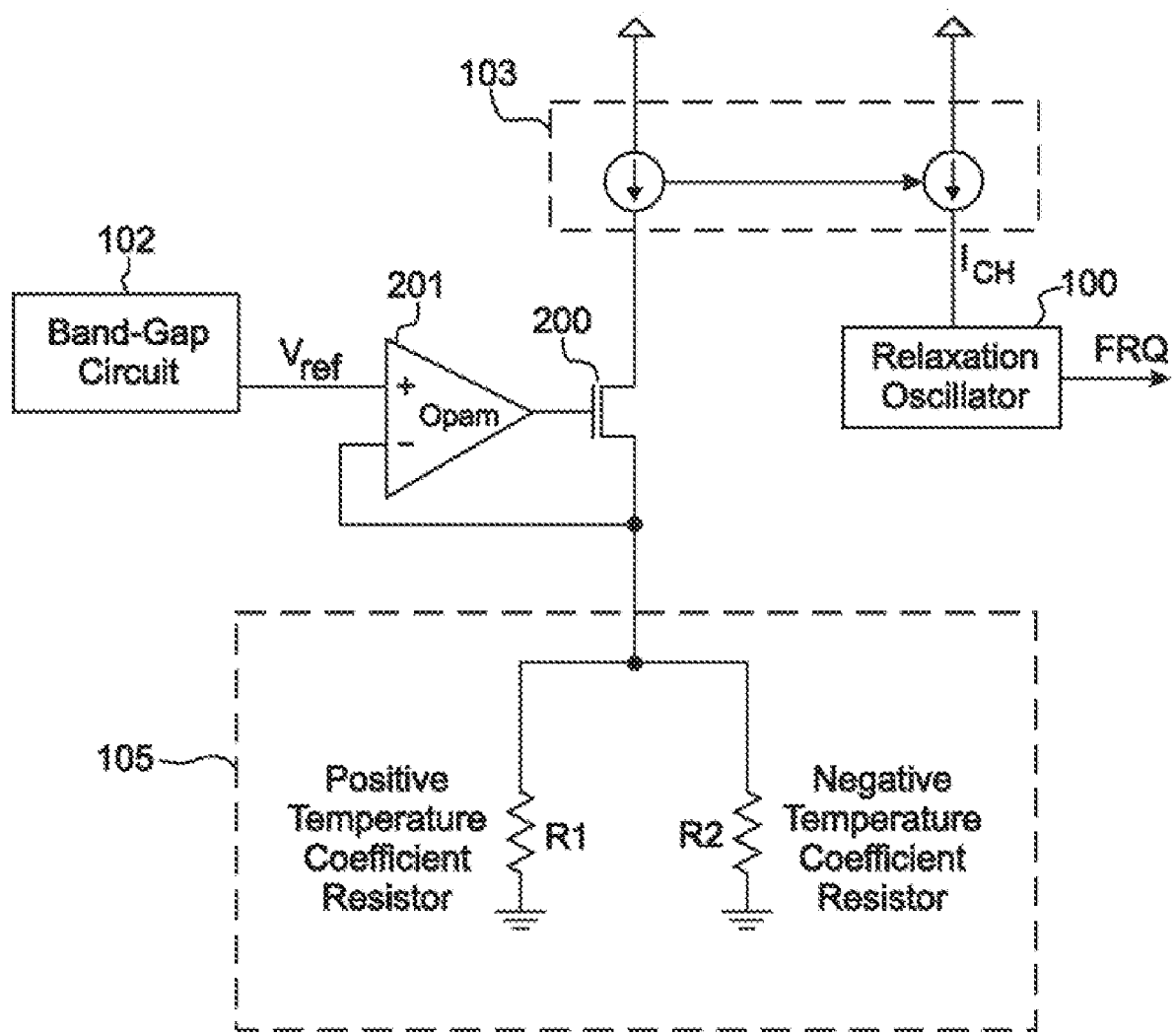
FIG. 4 shows yet another embodiment of a temperature-compensated relaxation oscillator circuit of the invention.
Figure 5:
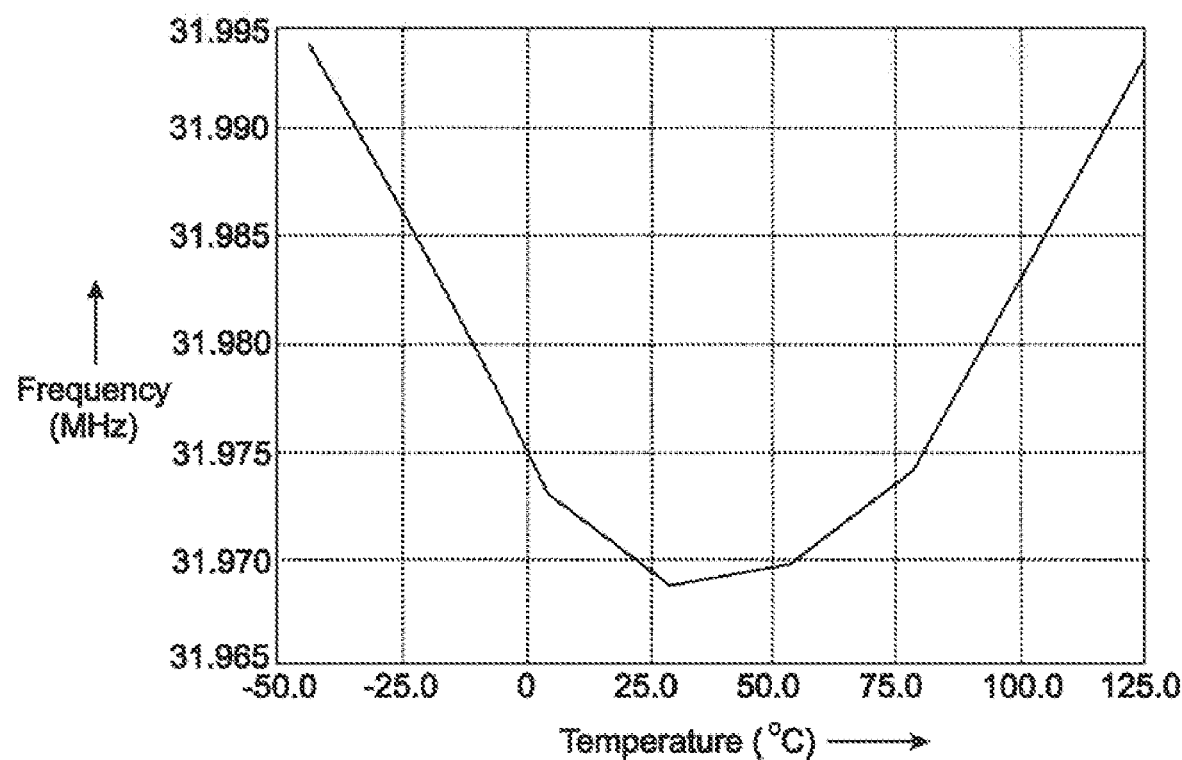
FIG. 5 shows a simulated output provided by the circuit of FIG. 4.

A simplified embodiment of the relaxation oscillator circuit shown in FIG. 1 is presented in FIG. 4. Resistor array 105 in FIG. 4 comprises a single positive temperature coefficient resistor R1 and a single negative temperature coefficient resistor R2. Appropriate: selection of the values for R1 and R2 in FIG. 4 leads to the simulated results shown in FIG. 5 where it will be seen that the frequency output provided by the relaxation oscillator circuit are substantially sensitive to the temperature variation under typical process conditions. As shown in FIG. 5, the average temperature coefficient is about 5 ppm/° C., which may be calculated as follows:

$$TC'_{OSC}=(31.995 \text{ MHz}-31.97 \text{ MHz})/(125° \text{ C.}+40° \\ \text{C.})/32 \text{ MHz}=4.7 \text{ ppm/° C.}\approx 5 \text{ ppm/° C.}$$

The simulation result provided at the other corner process condition will be different from that of the typical process simulation. The temperature coefficient of output signal FRQ provided by the circuit of in FIG. 1 can be minimized, however, by properly configuring switches S1 through Sn in resistor array 101 or 105.

Figure 6:
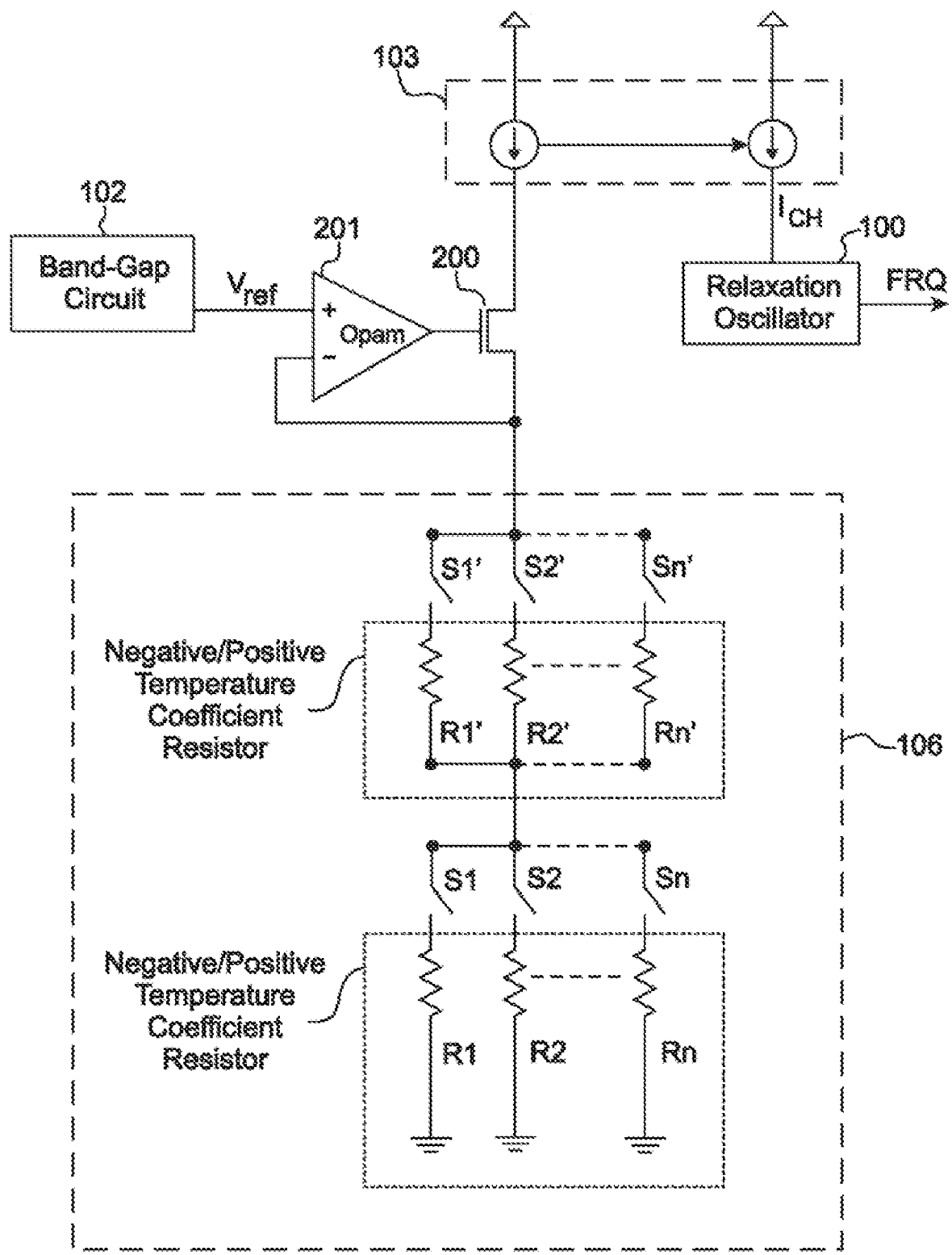
FIG. 6 shows still another embodiment of a temperature-compensated relaxation oscillator circuit of the invention.

Referring now to FIG. 6, there is shown another embodiment of the temperature-compensated relaxation oscillator circuit of the invention, where the positive and negative temperature coefficient resistors are arranged in series rather than in parallel (as in FIG. 1). In FIG. 6, the total temperature coefficient of the resistor array ($TC_{RA}$) may be adjusted to any value between $TC_{PR}$ and $TC_{NR}$ by switching on or off appropriate switches, S1 ... Sn and S1' ... Sn', in resistor array 106, and thereby varying the ratios of the values of the two different types of resistors.

It will now become apparent to those skilled in the art that the various embodiments of the invention disclosed herein provide several advantages, including, but not limited to, providing relaxation oscillators exhibiting superior temperature compensation characteristics that may be manufactured using low cost CMOS processes to build small packages without the need to employ expensive off-chip components.

Note that various types of resistors and manufacturing processes known in the art may be employed in the invention, in addition to those described above.

Note further that included within the scope of the present invention are methods of making and having made the various components, devices and systems described herein.

The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. A relaxation oscillator circuit, comprising:
a relaxation oscillator having an input, the relaxation oscillator being configured to provide an output signal having a frequency;
a field effect transistor (FET);
a current mirror circuit configured to provide a charging current to the input of the relaxation oscillator and a biasing current to a drain of the FET;
an operational amplifier having an output operably connected to a gate of the FET;
a band-gap circuit operably connected to a first input of the operational amplifier, and
a resistor array circuit having an output operably connected to a source of the FET and a second input of the operational amplifier;
wherein the resistor array circuit further comprises an array of positive temperature coefficient resistors arranged in parallel respecting one another and in parallel with respect to an array of negative temperature coefficient resistors arranged in parallel respecting one another, values of resistances provided by the positive temperature coefficient resistor array and the negative temperature coefficient resistor array being selectively controllable and selectable using switches operably connected to each of the resistors in the positive and negative arrays such that the frequency of the output signal remains substantially constant despite changes in the ambient temperature to which the relaxation oscillator circuit is subjected, the relaxation oscillator circuit having a temperature coefficient less than or equal to about 10 ppm/° C., the relaxation oscillator circuit further being one of a CMOS circuit and a BiCMOS circuit disposed on a single chip or integrated circuit.

2. The relaxation oscillator circuit of claim 1, wherein the positive temperature coefficient resistor array comprises diffusion resistor, a high-poly resistor, or an nwell resistor.

3. The relaxation oscillator circuit of claim 1, wherein the negative temperature coefficient resistor array comprises a high-poly resistor.

4. The relaxation oscillator circuit of claim 1, wherein the frequency of the output signal remains substantially constant over temperatures ranging between about −40 degrees Celsius and about +125 degrees Celsius.

5. The relaxation oscillator circuit of claim 1, wherein the output signal is a clock signal.

6. The relaxation oscillator circuit of claim 1, wherein the frequency of the output signal is programmable.

7. The relaxation oscillator circuit of claim 1, wherein the temperature coefficient of the relaxation oscillator circuit is less than or equal to about 5 ppm/° C.

8. A relaxation oscillator circuit, comprising:
a relaxation oscillator having an input, the relaxation oscillator being configured to provide an output signal having a frequency;
a field effect transistor (FET);
a current mirror circuit configured to provide a charging current to the input of the relaxation oscillator and a biasing current to a drain of the FET;
an operational amplifier having an output operably connected to a gate of the FET;
a band-gap circuit operably connected to a first input of the operational amplifier, and
a resistor array circuit having an output operably connected to a source of the FET and a second input of the operational amplifier;
wherein the resistor array circuit further comprises an array of positive temperature coefficient resistors arranged in parallel respecting one another and in series respecting an array of negative temperature coefficient resistors arranged in parallel respecting one another, values of resistances provided by the positive temperature coefficient resistor array and the negative temperature coefficient resistor array being selectively controllable and selectable using switches operably connected to each of the resistors in the positive and negative arrays such that the frequency of the output signal remains substantially constant despite changes in the ambient temperature to which the relaxation oscillator circuit is subjected, the relaxation oscillator circuit having a temperature coefficient less than or equal to about 10 ppm/° C., the relaxation oscillator circuit further being one of a CMOS circuit and a BiCMOS circuit disposed on a single chip or integrated circuit.

9. The relaxation oscillator circuit of claim 8, wherein the positive temperature coefficient resistor array comprises a diffusion resistor, a high-poly resistor, or an nwell resistor.

10. The relaxation oscillator circuit of claim 8, wherein the negative temperature coefficient resistor array comprises a high-poly resistor.

11. The relaxation oscillator circuit of claim 8, wherein the frequency of the output signal remains substantially constant over temperatures ranging between about −40 degrees Celsius and about +125 degrees Celsius.

12. The relaxation oscillator circuit of claim 8, wherein the output signal is a clock signal.

13. The relaxation oscillator circuit of claim 8, wherein the frequency of the output signal is programmable.

14. The relaxation oscillator circuit of claim 8, wherein the temperature coefficient of the relaxation oscillator circuit is less than or equal to about 5 ppm/° C.

15. A method of compensating for variations in a frequency of an output signal provided by a relaxation oscillator circuit, where the variations would otherwise be induced by changes in ambient temperature, comprising:
providing a relaxation oscillator having an input, the relaxation oscillator being configured to provide an output signal having a frequency;
providing a field effect transistor (FET);
providing a current mirror circuit configured to provide a charging current to the input of the relaxation oscillator and a biasing current to a drain of the FET;
providing an operational amplifier having an output operably connected to a gate of the FET;
providing a band-gap circuit operably connected to a first input of the operational amplifier, and
providing a resistor array circuit having an output operably connected to a source of the FET and a second input of the operational amplifier, wherein the resistor array circuit further comprises an array of positive temperature coefficient resistors arranged in parallel respecting one another and in parallel with respect to an array of negative temperature coefficient resistors arranged in parallel respecting one another, values of resistances provided by the positive temperature coefficient resistor array and the negative temperature coefficient resistor array being selectively controllable and selectable using switches operably connected to each of the resistors in the positive and negative arrays such that the frequency of the output signal remains substantially constant despite changes in the ambient temperature to which the relaxation oscillator circuit is subjected, the relaxation oscillator circuit having a temperature coefficient less than or equal to about 10 ppm/° C., the relaxation oscillator circuit further being one of a CMOS circuit and a BiCMOS circuit disposed on a single chip or integrated circuit.

16. A method of compensating for variations in a frequency of an output signal provided by a relaxation oscillator circuit, where the variations would otherwise be induced by changes in ambient temperature, comprising:
providing a relaxation oscillator having an input, the relaxation oscillator circuit being configured to provide an output signal having a frequency;
providing a field effect transistor (FET);
providing a current mirror circuit configured to provide a charging current to the input of the relaxation oscillator and a biasing current to a drain of the FET;
providing an operational amplifier having an output operably connected to a gate of the FET;
providing a band-gap circuit operably connected to a first input of the operational amplifier, and
providing a resistor array circuit having an output operably connected to a source of the FET and a second input of the operational amplifier, wherein the resistor array circuit further comprises an array of positive temperature coefficient resistors arranged in parallel respecting one another and in series respecting an array of negative temperature coefficient resistors arranged in parallel respecting one another, values of resistances provided by the positive temperature coefficient resistor array and the negative temperature coefficient resistor array being selectively controllable and selectable using switches operably connected to each of the resistors in the positive and negative arrays such that the frequency of the output signal remains substantially constant despite changes in the ambient temperature to which the relaxation oscillator circuit is subjected, the relaxation oscillator circuit having a temperature coefficient less than or equal to about 10 ppm/° C., the relaxation oscillator circuit further being one of a CMOS circuit and a BiCMOS circuit disposed on a single chip or integrated circuit.

* * * * *